(12) United States Patent
Nobori et al.

(10) Patent No.: US 10,199,245 B2
(45) Date of Patent: Feb. 5, 2019

(54) CERAMIC HEATER, HEATER ELECTRODE, AND METHOD FOR MANUFACTURING CERAMIC HEATER

(71) Applicant: NGK INSULATORS, LTD., Nagoya (JP)

(72) Inventors: Kazuhiro Nobori, Handa (JP); Takuji Kimura, Kariya (JP); Reo Watanabe, Handa (JP)

(73) Assignee: NGK Insulators, Ltd., Nagoya (JP)

( * ) Notice: Subject to any disclaimer, the term of this patent is extended or adjusted under 35 U.S.C. 154(b) by 972 days.

(21) Appl. No.: 13/848,776

(22) Filed: Mar. 22, 2013

(65) Prior Publication Data

US 2013/0256297 A1  Oct. 3, 2013

(30) Foreign Application Priority Data

Mar. 28, 2012 (JP) .................. 2012-073871

(51) Int. Cl.
*H01L 21/67* (2006.01)
*H01L 21/683* (2006.01)

(52) U.S. Cl.
CPC .... *H01L 21/67103* (2013.01); *H01L 21/6831* (2013.01)

(58) Field of Classification Search
CPC ......... H01L 21/6833; H05B 3/48; H05B 3/80; H05B 3/146; H01C 7/027; F01N 3/2026
(Continued)

(56) References Cited

U.S. PATENT DOCUMENTS 4,652,727 A * 3/1987 Hoshizaki ............... C04B 35/56
                                                    219/541
5,756,215 A * 5/1998 Sawamura ............ C04B 35/117
                                                    219/541
(Continued)

FOREIGN PATENT DOCUMENTS

JP  H04-325462 A  11/1992
JP   3336272 B   10/2002
(Continued)

OTHER PUBLICATIONS

Kikuchi et al. Effect of Ti-De-oxidation on Solidification and Post-solidification Microstructur in Low Carbon high Manganese Steel. ISIJ International, vol. 47 (2007), No. 9, pp. 1255-1264 [online], [retrieved on Apr. 12, 2016]. Retrieved from the Internet <URL: https://www.jstage.jst.go.jp/article/isijinternational/47/9/47_9_1255/_article>.*

(Continued)

*Primary Examiner* — Ibrahime A Abraham
*Assistant Examiner* — Jimmy Chou
(74) *Attorney, Agent, or Firm* — Burr & Brown, PLLC

(57) ABSTRACT

The electrostatic chuck includes a discoidal alumina ceramic substrate and a heater electrode and an electrostatic electrode embedded in the alumina ceramic substrate. The top surface of the alumina ceramic substrate is a wafer-mounting face. The heater electrode has a pattern, for example, of a single continuous line so as to realize electric wiring over the entire surface of the alumina ceramic substrate. Upon the application of a voltage, the heater electrode generates heat and heats the wafer W. The heater electrode is made of a complex oxide of titanium, aluminum, and magnesium (Ti—Al—Mg—O) dispersed in molybdenum.

11 Claims, 10 Drawing Sheets

(58) Field of Classification Search
USPC .... 219/544, 444.1, 390, 533, 548, 543, 552, 219/553; 29/611
See application file for complete search history.

(56) References Cited

U.S. PATENT DOCUMENTS

| | | | | |
|---|---|---|---|---|
| 5,783,333 | A * | 7/1998 | Mayer | H01M 4/131 423/332 |
| 6,620,343 | B1 * | 9/2003 | Blok | H01C 17/06586 252/511 |
| 6,953,918 | B2 * | 10/2005 | Kano | H01L 21/67103 219/542 |
| 8,282,878 | B2 * | 10/2012 | Croft | C04B 35/565 264/603 |
| 8,835,813 | B2 * | 9/2014 | Kato | H01L 21/67115 118/50.1 |
| 2002/0043527 | A1 * | 4/2002 | Ito | H01L 21/67103 219/444.1 |
| 2002/0185487 | A1 * | 12/2002 | Divakar | H01L 21/67103 219/444.1 |
| 2003/0121906 | A1 * | 7/2003 | Abbott | B29C 45/73 219/543 |
| 2003/0183615 | A1 * | 10/2003 | Yamaguchi | H01L 21/67103 219/444.1 |
| 2004/0021475 | A1 * | 2/2004 | Ito | G01R 31/2886 324/755.01 |
| 2004/0108314 | A1 * | 6/2004 | Kano | H01L 21/67103 219/764 |
| 2006/0012087 | A1 | 1/2006 | Matsuda et al. | |
| 2006/0199722 | A1 | 9/2006 | Aihara et al. | |
| 2007/0223174 | A1 * | 9/2007 | Mori | C04B 35/581 361/234 |
| 2007/0243658 | A1 * | 10/2007 | Hirai | H01L 51/0004 438/99 |
| 2008/0017632 | A1 * | 1/2008 | Maki | H01L 21/67103 219/543 |
| 2008/0049374 | A1 * | 2/2008 | Morioka | H01L 21/6831 361/234 |
| 2008/0142755 | A1 * | 6/2008 | Vaidhyanathan | C03C 8/02 252/71 |
| 2008/0174930 | A1 * | 7/2008 | Hattori | B29C 43/006 361/234 |
| 2008/0266745 | A1 * | 10/2008 | Nobori | H01L 21/6831 361/234 |
| 2009/0243235 | A1 * | 10/2009 | Nobori | H01L 21/6831 279/128 |
| 2009/0309496 | A1 * | 12/2009 | Asano | H01J 9/02 313/586 |
| 2010/0243635 | A1 * | 9/2010 | Nakamura | F23Q 7/22 219/270 |
| 2010/0248935 | A1 | 9/2010 | Teratani et al. | |
| 2012/0077020 | A1 * | 3/2012 | Muramatsu | B82Y 30/00 428/319.1 |
| 2013/0101754 | A1 * | 4/2013 | Shimomura | H01L 51/5246 427/555 |
| 2013/0200067 | A1 * | 8/2013 | Hirano | C04B 35/645 219/544 |

FOREIGN PATENT DOCUMENTS

| | | |
|---|---|---|
| JP | 2005-343733 A | 12/2005 |
| JP | 2006-225185 A | 8/2006 |
| JP | 2011-168472 A1 | 9/2011 |

OTHER PUBLICATIONS

Taiwanese Office Action, Taiwanese Application No. 20130110606, dated Oct. 24, 2016 (4 pages).
Japanese Office Action, Japanese Application No. 2013-058387, dated Sep. 6, 2016 (4 pages).
Korean Office Action (Application No. 10-2013-0032510) dated Apr. 6, 2017 (with English translation).

* cited by examiner

CERAMIC HEATER, HEATER ELECTRODE, AND METHOD FOR MANUFACTURING CERAMIC HEATER

BACKGROUND OF THE INVENTION

1. Field of the Invention

The present invention relates to a ceramic heater, a heater electrode, and a method for manufacturing a ceramic heater.

2. Description of the Related Art

One known ceramic heater for heating semiconductor wafers is a sintered alumina disc having an embedded heater electrode. For example, Patent Literature 1 discloses a method for manufacturing a ceramic heater, including preparing two compacts having a predetermined shape from a mixed powder of alumina and magnesium fluoride, applying a paste for a heater electrode to one of the compacts and then placing the other compact thereon, and firing the laminate at a low firing temperature in the range of 1120° C. to 1300° C. In a process of manufacturing a ceramic heater, use of WC as a paste in high-temperature firing at 1700° C. results in sufficient sintering of WC and electrical characteristics suitable for a heater electrode. However, in low-temperature firing at a temperature in the range of 1120° C. to 1300° C., use of WC as a paste results in considerable falling of particles, making electrical resistance measurement impossible, and use of a mixed powder of WC and alumina as a paste results in insufficient densification of the resulting electrode and poor electrical characteristics (Comparative Examples 21 and 22 in Patent Literature 1). Thus, a mixed powder of WC, Ni, and alumina is used as a paste in Patent Literature 1.

CITATION LIST

Patent Literature

PTL 1: Japanese Unexamined Patent Application Publication No. 2011-168472

SUMMARY OF THE INVENTION

As described above, the manufacture of a ceramic heater by means of low-temperature firing may involve the use of a mixed powder of WC, Ni, and alumina as a paste for a heater electrode as described in Patent Literature 1. On the other hand, without sticking to WC, it is also desirable to develop an alternative material to WC. The present inventors have searched for an alternative material to WC that has no adverse effects on plasma controllability and has substantially the same electric resistivity as WC. Although one possible alternative material was molybdenum, use of a molybdenum paste had unfavorable problems with respect to the relationship between set temperature, the distance from the center of a ceramic heater, and electric resistivity. More specifically, the ordinal arrangement of distances from the center to measuring points of electric resistivity in increasing order of electric resistivity at 20° C. is different from the ordinal arrangement of distances from the center to the measuring points in increasing order of electric resistivity at 60° C. This problem is hereinafter referred to as a reverse phenomenon of the temperature dependence of resistivity. The reverse phenomenon unfavorably makes the temperature control of a ceramic heater very complicated.

The present invention solves such problems. It is a principal object of the present invention to ameliorate a reverse phenomenon of the temperature dependence of resistivity in a ceramic heater that has a heater electrode embedded in an alumina ceramic substrate.

Solution to Problem

A ceramic heater of the present invention includes an alumina ceramic substrate; and a heater electrode embedded in the alumina ceramic substrate, the heater electrode being composed of molybdenum containing at least a titanium component.

The ceramic heater includes a heater electrode composed of molybdenum containing at least a titanium component and can therefore ameliorate the reverse phenomenon of the temperature dependence of resistivity. Although the reason for this is not clear, it is supposed that molybdenum carbide may be unevenly distributed in the heater electrode in the absence of the titanium component, and the reverse phenomenon may occur due to the action of molybdenum carbide. The titanium component may prevent the formation of molybdenum carbide and consequently suppress the reverse phenomenon. The carbon source is probably an organic component (such as a binder) contained in the heater electrode.

In a ceramic heater according to the present invention, the heater electrode may contain a complex oxide of titanium, aluminum, and magnesium (Ti—Al—Mg—O) dispersed in molybdenum.

In a ceramic heater according to the present invention, the alumina ceramic substrate may be manufactured by adding magnesium fluoride as a sintering aid to alumina particles and firing the alumina particles, and the heater electrode may be manufactured by using an electrode material containing a molybdenum powder, a titanium powder, and an alumina powder together with an acrylic binder. A compact containing alumina particles and magnesium fluoride as a sintering aid can sufficiently sinter at a low temperature (1120° C. to 1300° C.). The electrode material containing a molybdenum powder, a titanium powder, and an alumina powder together with an acrylic binder can be fired at a low temperature to form an electrode having satisfactory functions. Molybdenum carbide is rarely formed by firing in the heater electrode, and the reverse phenomenon of the temperature dependence of resistivity can be suppressed.

A method for manufacturing a ceramic heater according to the present invention includes (a) charging a forming die with a slurry containing an alumina powder, magnesium fluoride serving as a sintering aid, a solvent, a dispersant, and a gelling agent, inducing a chemical reaction of the gelling agent in the forming die to cause gelation of the slurry, and removing a compact from the forming die, thus forming first and second ceramic compacts, (b) drying, degreasing, and then calcining the first and second ceramic compacts to form first and second ceramic calcined compacts, (c) printing a paste containing a molybdenum powder and a titanium powder to a surface of one of the first and second ceramic calcined compacts, and (d) hot-press firing the first and second ceramic calcined compacts with the printed paste interposed therebetween at a temperature in the range of 1120° C. to 1300° C., or alternatively, (a) charging a forming die with a slurry containing an alumina powder, magnesium fluoride serving as a sintering aid, a solvent, a dispersant, and a gelling agent, inducing a chemical reaction of the gelling agent in the forming die to cause gelation of the slurry, and removing a compact from the forming die, thus forming first and second ceramic compacts, (b) printing a paste containing a molybdenum powder and a titanium powder to a surface of one of the first and second ceramic compacts, (c) drying, degreasing, and then calcining the first and second ceramic compacts to form first and second ceramic calcined compacts, and (d) hot-press firing the first and second ceramic calcined compacts at a temperature in the range of 1120° C. to 1300° C. while a portion to which the paste is printed is interposed therebetween.

A ceramic heater according to the present invention can be easily manufactured by the method for manufacturing a ceramic heater. Since the ceramic calcined compacts are laminated and are fired by hot pressing, each of the ceramic calcined compacts experiences the same number of firing treatments. This tends to make density uniform and prevent warping of the heater electrode. The process (a) employs a gel casting method and a ceramic compact produced by the gelation of a slurry in which an alumina powder having a smaller particle size than an alumina granulated powder is dispersed and mixed. This tends to make density uniform and prevent warping of the heater electrode.

In the method for manufacturing a ceramic heater according to the present invention, the paste in the application of the paste may be a mixture of a molybdenum powder, a titanium powder, an aluminum powder, and an acrylic binder. When molybdenum carbide is produced by a reaction between carbon derived from a binder and molybdenum, molybdenum carbide having different electric resistivity is interspersed in molybdenum in a heater electrode and tends to cause the reverse phenomenon of the temperature dependence of resistivity. However, use of an acrylic binder that negligibly produces carbon as a binder can reduce the production of molybdenum carbide and suppress the reverse phenomenon of the temperature dependence of resistivity.

In a method for manufacturing a ceramic heater according to the present invention, the titanium powder is preferably a ground powder or preferably has an average particle size in the range of 1.0 to 4.0 μm. This allows the titanium powder to be more uniformly distributed in the paste and a complex oxide (Ti—Al—Mg—O) to be more uniformly distributed in the heater electrode after hot-press firing. This can further reduce in-plane variations in resistivity. The average particle size is measured by laser diffraction and scattering (the same applies hereinafter).

BRIEF DESCRIPTION OF THE DRAWINGS

FIG. 9A is a cross section at a low magnification. FIG. 9B is an enlarged cross section of a square area in FIG. 9A.

DETAILED DESCRIPTION OF THE INVENTION

Figure 1:
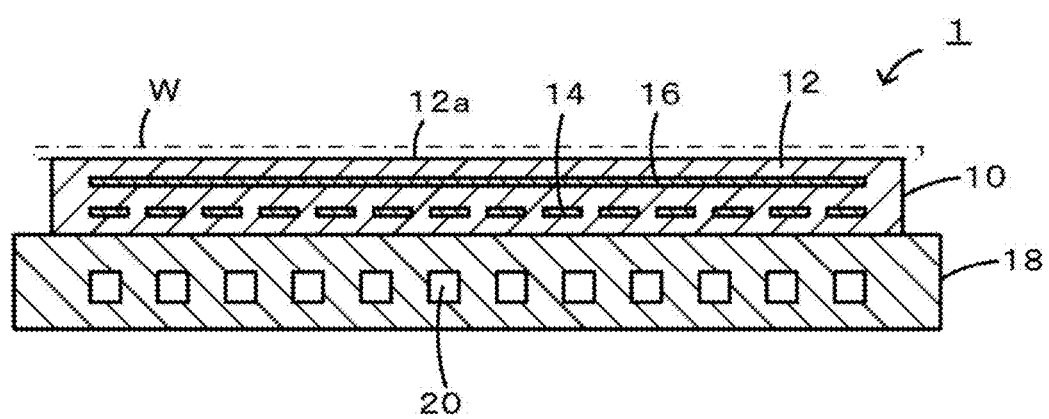
FIG. 1 is a cross-sectional view of a member 1 for a semiconductor manufacturing apparatus.

Preferred embodiments of the present invention will be described below with reference to the accompanying drawings. FIG. 1 is a cross-sectional view of a member 1 for a semiconductor manufacturing apparatus.

A member 1 for a semiconductor manufacturing apparatus includes an electrostatic chuck 10 and a cooling plate 18 disposed on the back side of the electrostatic chuck 10. The electrostatic chuck 10 can adsorb a silicon wafer W, which is to be subjected to plasma processing. The cooling plate 18 can serve as a support.

The electrostatic chuck 10 includes a discoidal alumina ceramic substrate 12 and a heater electrode 14 and an electrostatic electrode 16 embedded in the alumina ceramic substrate 12. The top surface of the alumina ceramic substrate 12 is a wafer-mounting face 12a. The heater electrode 14 has a pattern, for example, of a single continuous line so as to realize electric wiring over the entire surface of the alumina ceramic substrate 12. Upon the application of a voltage, the heater electrode 14 generates heat and heats the wafer W. The heater electrode 14 is made of a complex oxide of titanium, aluminum, and magnesium (Ti—Al—Mg—O) dispersed in molybdenum. A voltage can be applied to the heater electrode 14 from the back side of the cooling plate 18 through rod-like terminals (not shown), each of which reaches the corresponding end of the heater electrode 14. The electrostatic electrode 16 is a planar electrode to which a direct-current voltage can be applied with an external power supply (not shown). Upon the application of a direct-current voltage to the electrostatic electrode 16, the wafer W is adsorbed to the wafer-mounting face 12a by the action of Coulomb force or Johnsen-Rahbek force. When the direct-current voltage drops, the wafer W is released from the wafer-mounting face 12a.

The cooling plate 18 is a metallic (for example, aluminum) disc and is attached to a surface of the electrostatic chuck 10 opposite the wafer-mounting face 12a through a bonding layer (not shown). The cooling plate 18 includes a refrigerant path 20 through which a refrigerant (for example, water) cooled by an external cooling apparatus (not shown) circulates. The refrigerant path 20 may be a single continuous line such that the refrigerant can pass through the entire cooling plate 18.

A usage example of the member 1 for a semiconductor manufacturing apparatus will be described below. The member 1 for a semiconductor manufacturing apparatus is placed in a chamber (not shown). A surface of the wafer W is etched with plasma generated in the chamber. The temperature of the wafer W is maintained at a constant temperature by controlling the electric power supplied to the heater electrode 14 or the flow rate of the refrigerant circulating through the refrigerant path 20 of the cooling plate 18.

Manufacturing procedures for the electrostatic chuck 10 of the member 1 for a semiconductor manufacturing apparatus will be described below. A first manufacturing procedure and a second manufacturing procedure will be described below. FIGS. 2A to 2D are explanatory views of the first manufacturing procedure. FIGS. 3A to 3D are explanatory views of the second manufacturing procedure.

1. First Manufacturing Procedure (see FIGS. 2A to 2D)

Figure 2A:
FIGS. 2A to 2D are process drawings illustrating first manufacturing procedures for an electrostatic chuck 10.

(a) Preparation of Compact (see FIG. 2A)

First to third compacts 51 to 53 are formed. The compacts 51 to 53 are formed by charging a forming die with a slurry containing an alumina powder, magnesium fluoride serving as a sintering aid, a solvent, a dispersant, and a gelling agent, inducing a chemical reaction of the gelling agent in the forming die to cause gelation of the slurry, and removing a compact from the forming die.

The solvent may be any solvent that can dissolve the dispersant and the gelling agent. Examples of the solvent include hydrocarbon solvents (such as toluene, xylene, and solvent naphtha), ether solvents (such as ethylene glycol monoethyl ether, butyl carbitol, and butyl carbitol acetate), alcohol solvents (such as isopropanol, 1-butanol, ethanol, 2-ethylhexanol, terpineol, ethylene glycol, and glycerin), ketone solvents (such as acetone and methyl ethyl ketone), ester solvents (such as butyl acetate, dimethyl glutarate, and triacetin), and polybasic acid solvents (such as glutaric acid). In particular, solvents having two or more ester bonds, such as polybasic acid esters (for example, dimethyl glutarate) and polyhydric alcohol acid esters (for example, triacetin), are preferably used.

The dispersant may be any dispersant that can uniformly disperse the alumina powder in the solvent. Examples of the dispersant include polycarboxylic acid copolymers, polycarboxylic acid salts, sorbitan fatty acid esters, polyglycerin fatty acid esters, phosphate salt copolymers, sulfonate copolymers, and polyurethane polyester copolymers having a tertiary amine. In particular, polycarboxylic acid copolymers and polycarboxylic acid salts are preferably used. The addition of the dispersant can reduce the viscosity and increase the flowability of the slurry before forming.

The gelling agent may contain an isocyanate, a polyol, and a catalyst. The isocyanate may be any substance that has an isocyanate group as a functional group. Examples of the isocyanate include tolylene diisocyanate (TDI), diphenylmethane diisocyanate (MDI), and modified products thereof. The isocyanate may have a reactive functional group other than the isocyanate group or may have many reactive functional groups as in a polyisocyanate. The polyol may be any substance that has two or more hydroxy groups reactive with an isocyanate group. Examples of the polyol include ethylene glycol (EG), poly(ethylene glycol) (PEG), propylene glycol (PG), poly(propylene glycol) (PPG), poly(tetramethylene glycol) (PTMG), poly(hexamethylene glycol) (PHMG), and poly(vinyl alcohol) (PVA). The catalyst may be any substance that can promote a urethane reaction between the isocyanate and the polyol. Examples of the catalyst include triethylenediamine, hexanediamine, and 6-dimethylamino-1-hexanol.

In the process (a), preferably, a solvent and a dispersant are added to an alumina powder and a magnesium fluoride powder at a predetermined ratio and are mixed for a predetermined time to prepare a slurry precursor, and a gelling agent is then added to the slurry precursor, is mixed, and is degassed under vacuum to prepare a slurry. The mixing method in the preparation of the slurry precursor or the slurry is not particularly limited and may employ a ball mill, a planetary mill, a vibrating mill, or a propeller mixer. In the slurry prepared by the addition of the gelling agent to the slurry precursor, a chemical reaction (urethane reaction) of the gelling agent proceeds with time. Thus, the slurry is preferably rapidly charged into the forming die. The slurry in the forming die becomes a gel by the chemical reaction of the gelling agent in the slurry. The chemical reaction of the gelling agent is a urethane reaction between an isocyanate and a polyol forming a urethane resin (polyurethane). The slurry becomes a gel by the reaction of the gelling agent. The urethane resin functions as an organic binder.

Figure 2B:
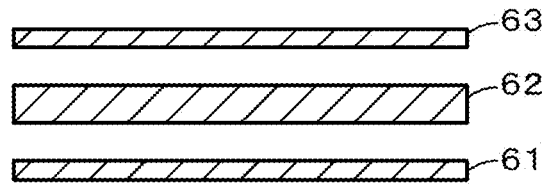

(b) Preparation of Calcined Compact (see FIG. 2B)

The first to third compacts 51 to 53 are dried, are degreased, and are calcined to form first to third calcined compacts 61 to 63. The compacts 51 to 53 are dried in order to evaporate the solvents of the compacts 51 to 53. The drying temperature and the drying time are appropriately determined in accordance with the type of solvent. The drying temperature is carefully determined so as not to cause a crack in the compacts 51 to 53 during drying. The drying may be performed in the air, in an inert atmosphere, or under vacuum. The compacts 51 to 53 after drying are degreased in order to decompose and remove organic substances, such as the dispersant, the catalyst, and the binder. The degreasing temperature may be appropriately determined in accordance with the type of organic substance and may be in the range of 400° C. to 600° C. The degreasing may be performed in the air, in an inert atmosphere, or under vacuum. The compacts 51 to 53 after degreasing is calcined in order to increase their strength and thereby make the compacts 51 to 53 easy to handle. The calcination temperature is not particularly limited and may be in the range of 750° C. to 900° C. The calcination may be performed in the air, in an inert atmosphere, or under vacuum.

Figure 2C:
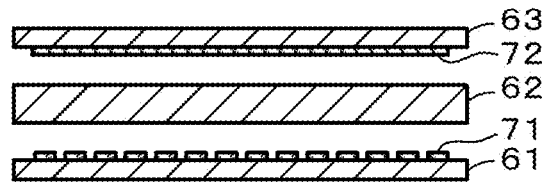

(c) Application of Electrode Paste (see FIG. 2C)

A heater electrode paste 71 is printed to one surface of the first calcined compact 61. An electrostatic electrode paste 72 is printed to one surface of the third calcined compact 63. Each of the pastes 71 and 72 contains an alumina ceramic powder, a molybdenum powder, a titanium powder, a binder, and a solvent. Examples of the binder include cellulose binders (such as ethylcellulose), acrylic binders (such as poly(methyl methacrylate)), and vinyl binders (such as poly(vinyl butyral)). Examples of the solvent include terpineol. The application method may be a screen printing method. The alumina ceramic powder preferably has an average particle size in the range of 0.40 to 0.60 μm, more preferably 0.45 to 0.55 μm. The molybdenum powder preferably has an average particle size in the range of 1.0 to 2.0 μm, more preferably 1.3 to 1.6 μm. The titanium powder preferably has an average particle size in the range of 1.0 to 4.0 μm, more preferably 1.5 to 3.5 μm.

Figure 2D:
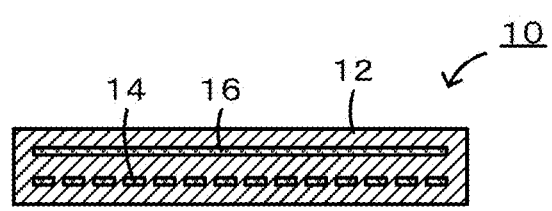

(d) Hot-Press Firing (see FIG. 2D)

The second calcined compact 62 is placed on the first calcined compact 61 with the heater electrode paste 71 interposed therebetween, and the third calcined compact 63 is placed on the second calcined compact 62 with the electrostatic electrode paste 72 interposed therebetween. These calcined compacts 61 to 63 are then hot-press fired. The heater electrode paste 71 is fired to form the heater electrode 14. The electrostatic electrode paste 72 is fired to form the electrostatic electrode 16. The calcined compacts 61 to 63 are sintered to form the alumina ceramic substrate 12. Thus, the electrostatic chuck 10 is completed. The pressing pressure in the hot-press firing is preferably in the range of 30 to 300 kgf/cm$^2$, more preferably 50 to 250 kgf/cm$^2$, at least at a maximum temperature (firing temperature). Since magnesium fluoride is added to the alumina powder, the maximum temperature may be lower (1120° C. to 1300° C.) than the maximum temperature in the absence of magnesium fluoride. The hot-press firing atmosphere may be appropriately selected from the air, an inert atmosphere, and a vacuum atmosphere.

In such low-temperature firing, for example, use of a generally used paste containing tungsten carbide as an electrode paste cannot achieve the target electrical conductivity because tungsten carbide cannot be fired. Thus, a paste containing a molybdenum powder is used as an electrode paste. In this case, however, molybdenum reacts with carbon (probably derived from an organic substance in the paste) to form molybdenum carbide, which is unevenly distributed in the electrode, causing the reverse phenomenon of the temperature dependence of resistivity. In order to ameliorate the reverse phenomenon, various additives were tested, and the addition of a titanium powder ameliorated the reverse phenomenon. It is therefore supposed that titanium is effective in preventing carbonization of molybdenum. The heater electrode 14 thus prepared is made of a complex oxide of titanium, aluminum, and magnesium (Ti—Al—Mg—O) dispersed in molybdenum. Molybdenum and titanium are derived from the electrode paste, aluminum is derived from the electrode pastes 71 and 72 and the calcined compacts 61 and 62, and magnesium is derived from the calcined compacts 61 and 62. Use of an acrylic binder as the binder can improve the effect of preventing carbonization of molybdenum as compared with the other binders.

2. Second Manufacturing Procedure (see FIGS. 3A to 3D)

Figure 3A:
FIGS. 3A to 3D are process drawings illustrating second manufacturing procedures for the electrostatic chuck 10.
Figure 3B:
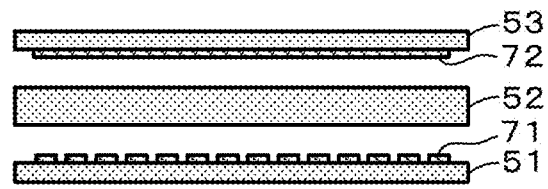

(a) Preparation of Compact (see FIG. 3A)

First to third compacts 51 to 53 are prepared. This process is the same as the process for "(a) Preparation of Compact" of "1. First Manufacturing Procedure".

(b) Application of Electrode Paste (see FIG. 31B)

The heater electrode paste 71 is printed to one surface of the first compact 51, and the electrostatic electrode paste 72 is printed to one surface of the third compact 53. The pastes 71 and 72 are the same as the pastes used in "(c) Application of Electrode Paste" of "1. First Manufacturing Procedure".

Figure 3C:
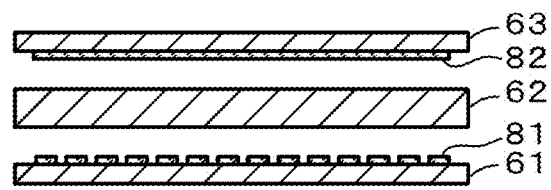

(c) Preparation of Calcined Compact (see FIG. 3C)

The first to third compacts 51 to 53 (the electrode paste has been printed to the first and third compacts 51 and 53) are dried, are degreased, and are calcined to form the first to third calcined compacts 61 to 63. The printed pastes 71 and 72 become calcined pastes 81 and 82. This process is the same as the process for "(b) Preparation of Calcined Compact" of "1. First Manufacturing Procedure".

Figure 3D:
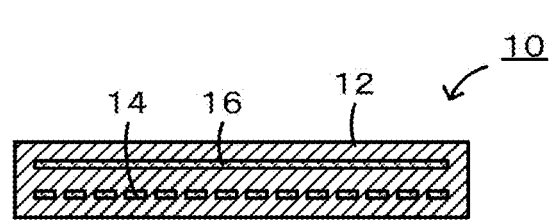

(d) Hot-Press Firing (see FIG. 3D)

The second calcined compact 62 is placed on the first calcined compact 61 with the calcined paste 81 interposed therebetween, and the third calcined compact 63 is placed on the second calcined compact 62 with the calcined paste 82 interposed therebetween. These calcined compacts 61 to 63 are then hot-press fired. The calcined paste 81 is fired to form the heater electrode 14. The calcined paste 82 is fired to form the electrostatic electrode 16. The calcined compacts 61 to 63 are sintered to form the alumina ceramic substrate 12. Thus, the electrostatic chuck 10 is completed. The hot-press firing conditions are described in "(d) Hot-Press Firing" of "1. First Manufacturing Procedure".

In accordance with the second manufacturing procedure, the compact to which the electrode paste has been printed is calcined. Thus, the electrode paste may be oxidized or carbonized during calcination. On the other hand, the electrode paste is not oxidized or carbonized in the first manufacturing procedure because the electrodes are formed on the calcined compact. In this respect, the first manufacturing procedure is superior to the second manufacturing procedure in electrode characteristics and variations in electrode characteristics.

In the electrostatic chuck 10 according to the present embodiment described in detail above, the heater electrode 14 is composed of molybdenum containing at least a titanium component. Thus, the reverse phenomenon of the temperature dependence of resistivity can be ameliorated. This is demonstrated by the examples described below.

In particular, the alumina ceramic substrate 12 is manufactured by adding magnesium fluoride as a sintering aid to alumina particles and firing the alumina particles, and the heater electrode 14 is manufactured by using an electrode paste containing a molybdenum powder, a titanium powder, and an alumina powder together with an acrylic binder. Thus, alumina can be sufficiently sintered even at a low firing temperature (1120° C. to 1300° C.). The heater electrode 14 formed by such low-temperature firing is made of a complex oxide of titanium, aluminum, and magnesium (Ti—Al—Mg—O) dispersed in molybdenum. This ensures the prevention of the reverse phenomenon of the temperature dependence of resistivity.

The present invention is not limited to the above-described embodiment. It is clear that the present invention can be implemented in a variety of embodiments without departing from the technical scope thereof.

For example, although the heater electrode 14 and the electrostatic electrode 16 are embedded in the alumina ceramic substrate 12 in the electrostatic chuck 10 according to the embodiment described above, only the heater electrode 14 may be embedded in the alumina ceramic substrate 12.

Although the first or second manufacturing procedure is described as a method for manufacturing the electrostatic chuck 10 in the embodiments described above, the electrostatic chuck 10 may be manufactured by any method. For example, although the process (a) employs a gel casting method, the compact may be manufactured by using another method. It may also be possible to prepare two sintered alumina bodies, print an electrode paste to one surface of each of the two sintered alumina bodies, place one of the two sintered alumina bodies in a forming die such that the printed surface faces upward, place a raw material powder containing an alumina powder and magnesium fluoride on the sintered alumina body, place the other of the two sintered alumina bodies on the raw material powder such that the printed surface faces downward, and hot-press fire the two sintered alumina bodies.

EXAMPLES

Example 1

The electrostatic chuck 10 was manufactured by using the first manufacturing procedure (see FIGS. 2A to 2D).

(a) Preparation of Compact 100 parts by weight of an alumina powder (having an average particle size of 0.5 μm and a purity of 99.99%), 0.2 parts by weight of magnesia, 0.3 parts by weight of magnesium fluoride, 3 parts by weight of a polycarboxylic acid copolymer serving as a dispersant, and 20 parts by weight of a polybasic acid ester serving as a solvent were mixed in a ball mill (trommel) for 14 hours to prepare a slurry precursor. The slurry precursor was mixed with a gelling agent containing 3.3 parts by weight of 4,4'-diphenylmethane diisocyanate as an isocyanate, 0.3 parts by weight of ethylene glycol as a polyol, and 0.1 parts by weight of 6-dimethylamino-1-hexanol as a catalyst in a planetary mill for 12 minutes to prepare a slurry. The slurry was charged into the first to third forming dies used in 1. of Example 1. The slurry was then left to stand at 22° C. for two hours to allow the gelling agent to undergo a chemical reaction in each of the forming dies, causing gelation of the slurry. The resulting compacts were then removed from the forming dies. The first to third compacts 51 to 53 were obtained from the first to third forming dies, respectively (see FIG. 2A).

(b) Preparation of Calcined Compact

The first to third compacts 51 to 53 were dried at 100° C. for 10 hours, were degreased at a maximum temperature of 500° C. for one hour, and were calcined at a maximum temperature of 820° C. in the air for one hour to form the first to third calcined compacts 61 to 63 (see FIG. 2B).

(c) Application of Electrode Paste

A molybdenum powder, a titanium powder, and an alumina powder in which the titanium content was 5% by weight and the alumina content was 10% by weight were mixed with poly(methyl methacrylate) as a binder and terpineol as a solvent to prepare an electrode paste. This electrode paste was used for an electrostatic electrode and a heater electrode. A heater electrode paste 71 was printed to one surface of the first calcined compact 61 by screen printing. An electrostatic electrode paste 72 was printed to one surface of the third calcined compact 63 by screen printing (see FIG. 2C). The molybdenum powder had an average particle size of 1.5 μm. The titanium powder had an average particle size of 30 μm. The alumina powder had an average particle size of 0.5 μm.

(d) Hot-Press Firing

The second calcined compact 62 was placed on the first calcined compact 61 with the heater electrode paste 71 interposed therebetween, and the third calcined compact 63 was placed on the second calcined compact 62 with the electrostatic electrode paste 72 interposed therebetween. These calcined compacts 61 to 63 were then hot-press fired. The heater electrode paste 71 was fired to form the heater electrode 14. The electrostatic electrode paste 72 was fired to form the electrostatic electrode 16. The calcined compacts 61 to 63 were sintered to form the alumina ceramic substrate 12 (see FIG. 2D). The hot-press firing was performed under vacuum at a pressure of 250 kgf/cm² at a maximum temperature of 1170° C. for two hours. A surface of a sintered ceramic body was ground with a diamond wheel such that the thickness from the electrostatic electrode 16 to the wafer-mounting face 12a was 350 μm and the thickness from the heater electrode 14 to the other surface was 750 μm. After side surface processing and drilling, terminals were attached to complete the electrostatic chuck 10. The electrostatic chuck 10 included the heater electrode 14 and the electrostatic electrode 16 and had a diameter of 300 mm. The electrostatic chuck 10 had a carbon content of 0.1% by weight or less and a relative density of 98% or more.

A portion between the electrostatic electrode 16 and the wafer-mounting face 12a is referred to as a dielectric layer. Variations in the thickness of the dielectric layer (variations in the difference between the maximum thickness and the minimum thickness of the dielectric layer) were 20 μm. When a compact was manufactured by using a method other than the gel casting method, variations in the thickness of the dielectric layer were 30 μm.

Example 2

The electrostatic chuck 10 was manufactured in the same manner as in Example 1 except that a ground powder was used as the titanium powder in the process (c) of Example 1. The ground powder was prepared by grinding a titanium powder having an average particle size of 30 μm in a bead mill. The ground powder had an average particle size of 3 μm. The electrostatic chuck 10 had a carbon content of 0.1% by weight or less and a relative density of 98% or more. Variations in the thickness of the dielectric layer were 20 μm.

Comparative Example 1

The electrostatic chuck 10 was manufactured in the same manner as in Example 1 except that the electrode paste was changed. The electrode paste was prepared as described below. The electrode paste was prepared by mixing a molybdenum powder and an alumina powder in which the alumina content was 10% by weight with poly(methyl methacrylate) as a binder and terpineol as a solvent to prepare an electrode paste.

Comparative Example 2

The electrostatic chuck 10 was manufactured in the same manner as in Example 1 except that the electrode paste was changed. The electrode paste was prepared as described below. The electrode paste was prepared by mixing a molybdenum powder, a tungsten powder, and an alumina powder in which the tungsten content was 5% by weight and the alumina content was 10% by weight with poly(methyl methacrylate) as a binder and terpineol as a solvent to prepare an electrode paste.

[Evaluation]

Temperature Dependence of Electric Resistivity

Figure 4:
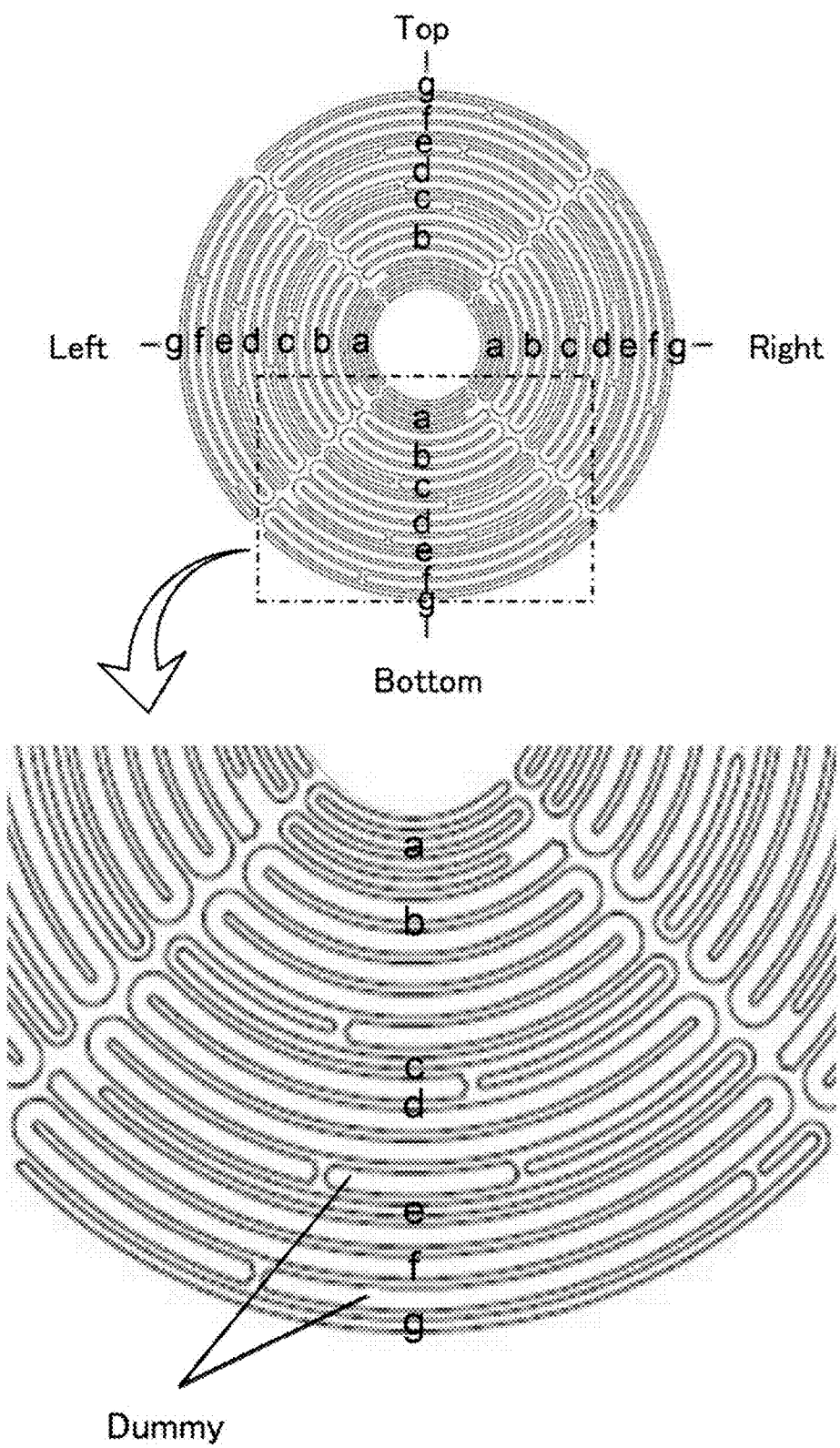
FIG. 4 is an explanatory view of the shape of a heater electrode in a test piece.
Figure 5:
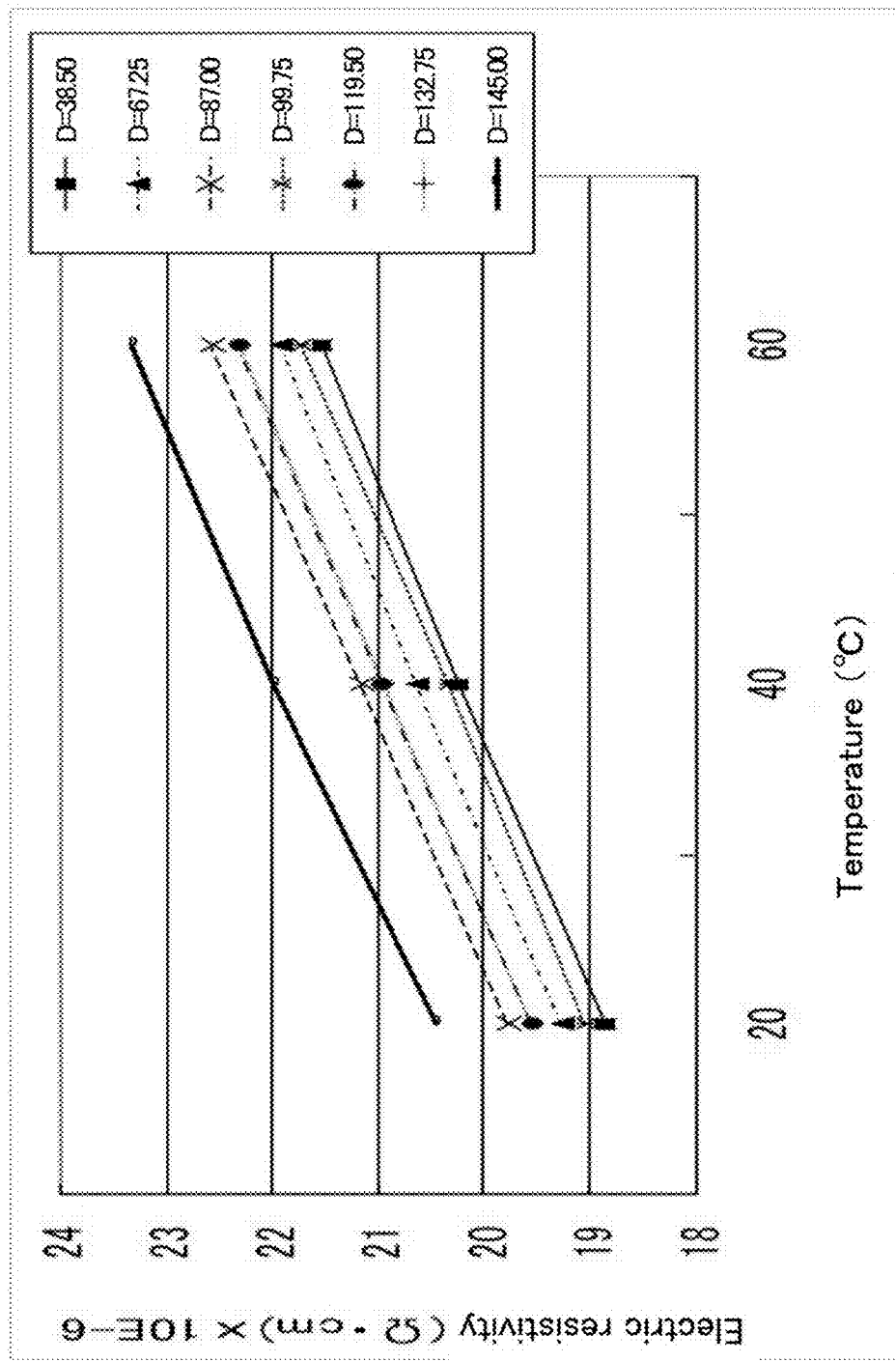
FIG. 5 is a graph of Example 1 illustrating the relationship between the distance D, set temperature, and electric resistivity.
Figure 6:
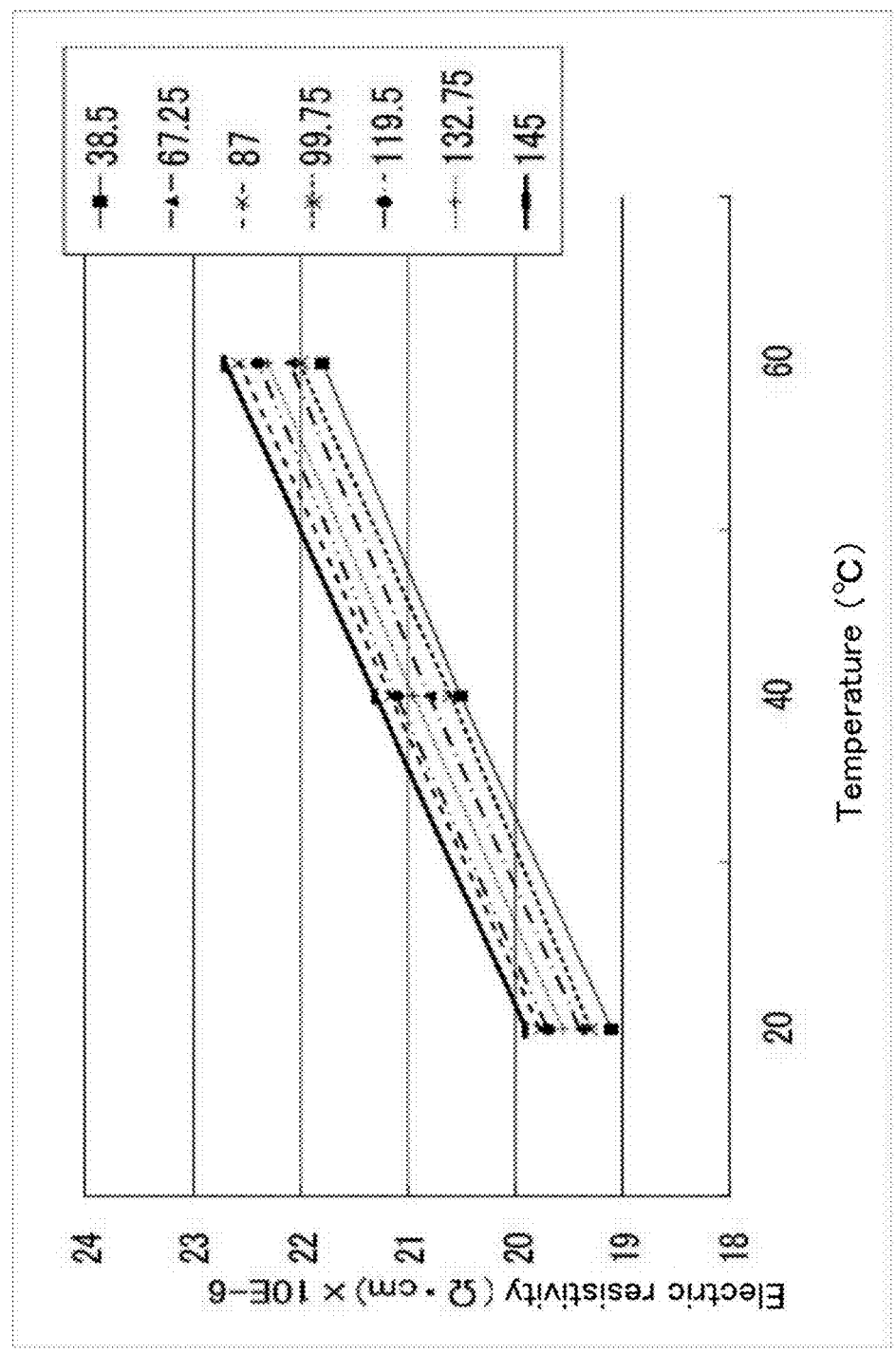
FIG. 6 is a graph of Example 2 illustrating the relationship between the distance D, set temperature, and electric resistivity.
Figure 7:
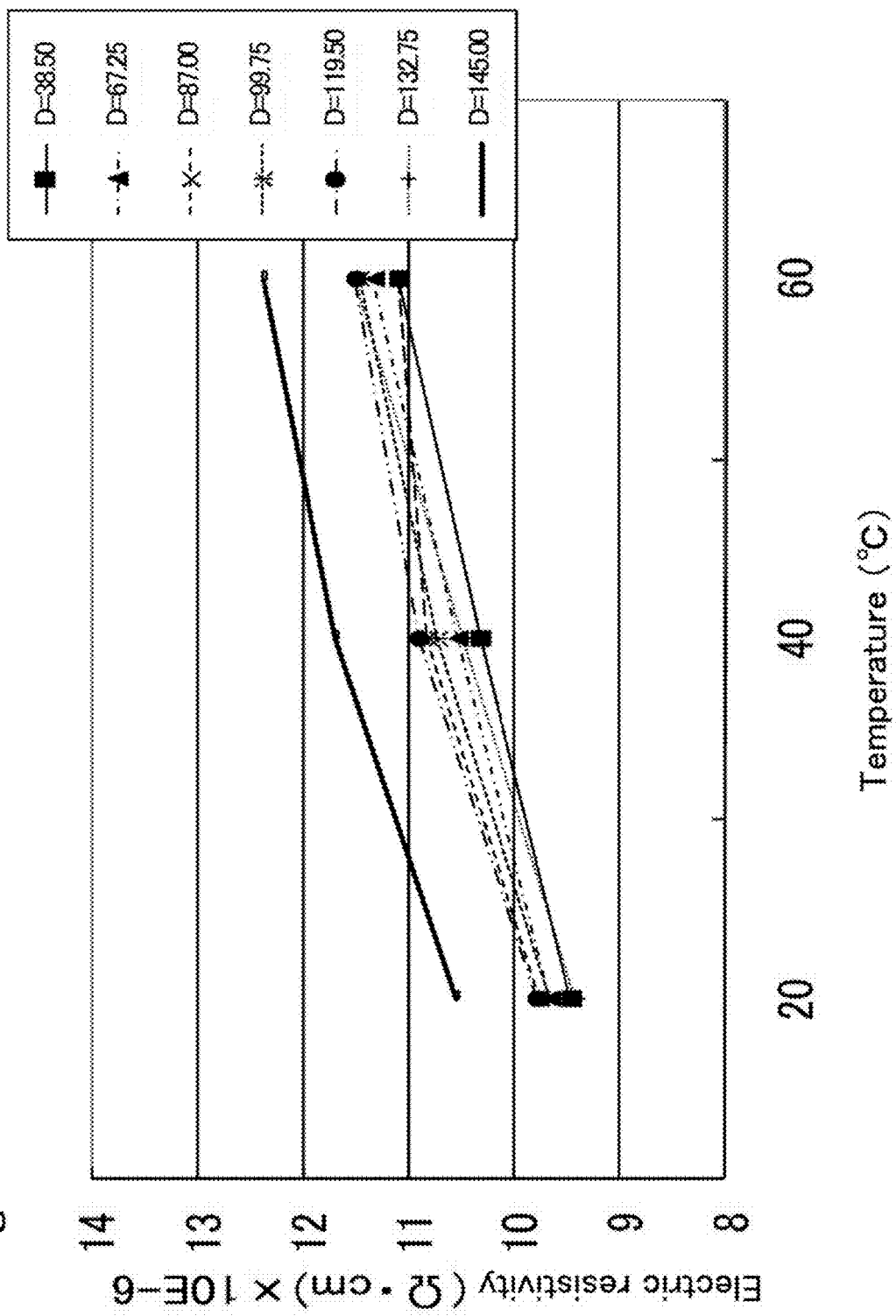
FIG. 7 is a graph of Comparative Example 1 illustrating the relationship between the distance D, set temperature, and electric resistivity.
Figure 8:
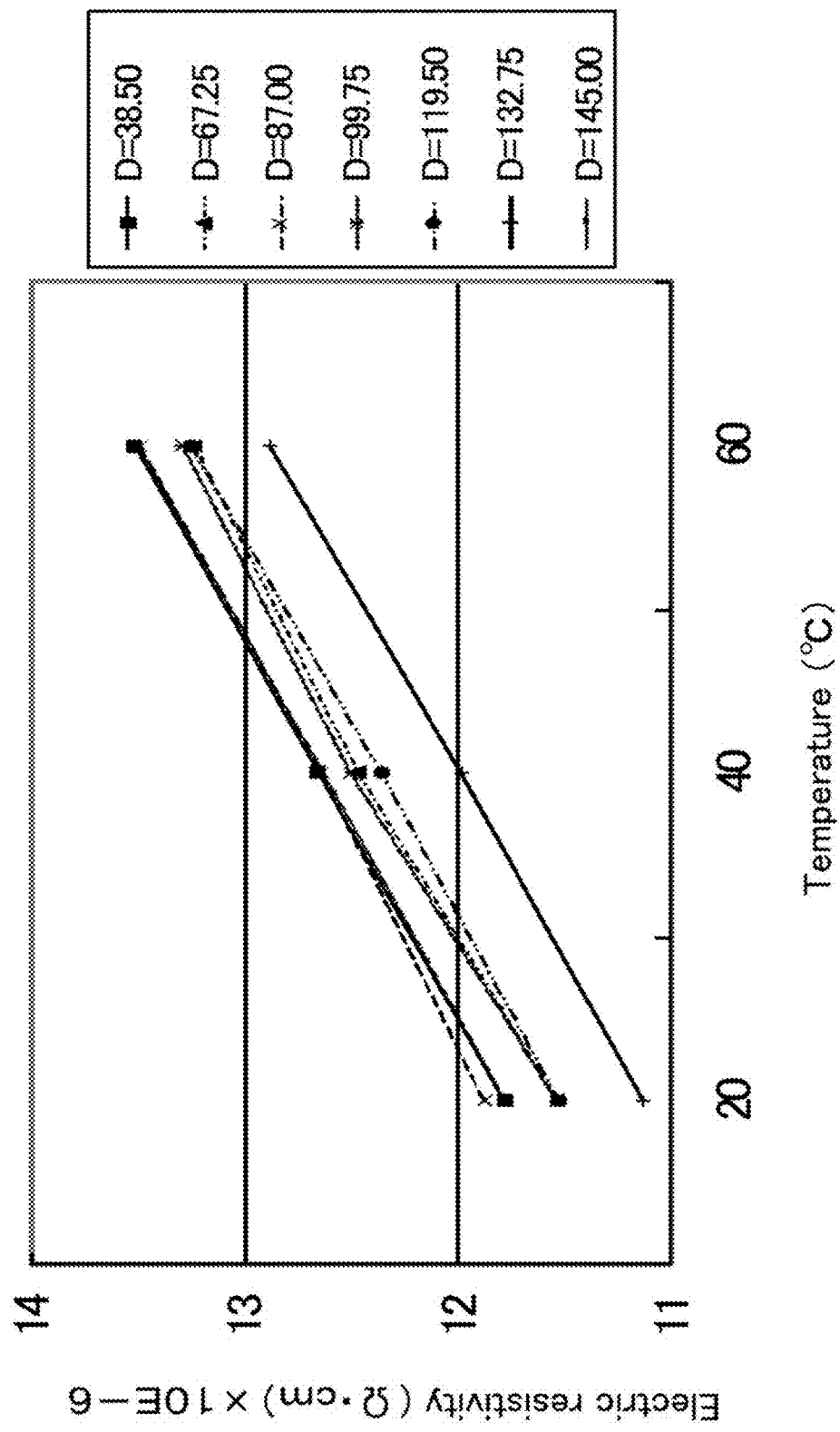
FIG. 8 is a graph of Comparative Example 2 illustrating the relationship between the distance D, set temperature, and electric resistivity.

The electric resistivity ρ (Ω·cm) of each of test pieces corresponding to Examples 1 and 2 and Comparative Examples 1 and 2 was measured. A heater electrode of each of the test pieces had a shape illustrated in FIG. 4. More specifically, a discoidal alumina ceramic substrate was divided into four sectors (having a central angle of 90 degrees). Each of the sectors included seven heater wires a to g and two dummy wires. Each of the heater wires a to g was formed in a zigzag along the arc and had terminals at both ends. The terminals of the heater wires a to g were buried before the alumina ceramic substrate 12 was fired and, after firing, were exposed by scraping the ceramic. The dummy wires were formed along an arc having a predetermined radius and had no terminal. Table 1 lists the distance D of the heater wires a to g from the center, the electrode width w (mm), and the electrode length L (mm). Although the electrode thickness t (mm) of each of the heater wires a to g is not listed in Table 1, the electrode thickness t (mm) was measured in a cross section of the alumina ceramic substrate 12 after firing.

TABLE 1

| Heater wire | Distance D from the center of the substrate to the center of the heater wire (mm) | Electrode width w (mm) | Electrode length L (mm) |
| --- | --- | --- | --- |
| a | 38.50 | 2.5 | 231.5 |
| b | 67.25 | 5.0 | 462.3 |
| c | 87.00 | 2.5 | 231.5 |
| d | 99.75 | 5.0 | 463.1 |
| e | 119.50 | 2.5 | 231.5 |
| f | 132.75 | 5.0 | 463.1 |
| g | 145.00 | 2.5 | 231.5 |

The test pieces were placed in a thermostat. The temperatures of the test pieces were set at a predetermined temperature. The set temperature was 20° C., 40° C., or 60° C. For each set temperature, the electric resistivity ρ (Ω·cm) of each of the heater wires a to g was measured. The electric resistivity ρ (Ω·cm) of each of the heater wires a to g was determined by measuring resistance R (Ω) between the terminals at both ends with a probe after firing and calculating electric resistivity using the following equation. The coefficient 10 on the right-hand side is to convert Ω·mm into Ω·cm. Graphs of FIGS. 5 to 8 show the relationship between the distance D from the center of the substrate to the center of the heater wire, set temperature, and electric resistivity for Examples 1 and 2 and Comparative Examples 1 and 2. The electric resistivity ρ on the vertical axis of the graphs is the mean value of the electric resistivities ρ of the four sectors.

$$\rho=10\times(R\times W\times t)/L$$

In the case of Example 1 (see FIG. 5), the ordinal arrangement of distance D in increasing order of electric resistivity at each set temperature is the same. More specifically, electric resistivity at a distance D=38.5 mm is the minimum, and electric resistivity increases in the order of 99.75 mm, 67.25 mm, 132.75 mm, 119.5 mm, and 87 mm, and electric resistivity at 145 mm is the maximum. This ordinal arrangement is the same at each of the set temperatures. Thus, the temperature of a wafer W is easy to control.

In contrast, in Comparative Example 1 (see FIG. 7), the ordinal arrangement of distance D in increasing order of electric resistivity changes with the set temperature (the reverse phenomenon of the temperature dependence of resistivity). For example, at 20° C., electric resistivity at a distance D=132.75 mm is the minimum, and electric resistivity increases in the order of 38.5 mm, 67.25 mm, 99.75 mm, 87 mm, and 119.5 mm, and electric resistivity at 145 mm is the maximum. At 60° C., however, electric resistivity at a distance D=38.5 mm is the minimum, and electric resistivity increases in the order of 87 mm, 67.25 mm, 99.75 mm, 132.75 mm, and 119.5 mm, and electric resistivity at 145 mm is the maximum. Such a reverse phenomenon makes the temperature control of a wafer W very complicated. Comparative Example 2 also had the reverse phenomenon of the temperature dependence of resistivity (see FIG. 8).

Elementary Analysis Using SEM-EDX

Figure 9A:
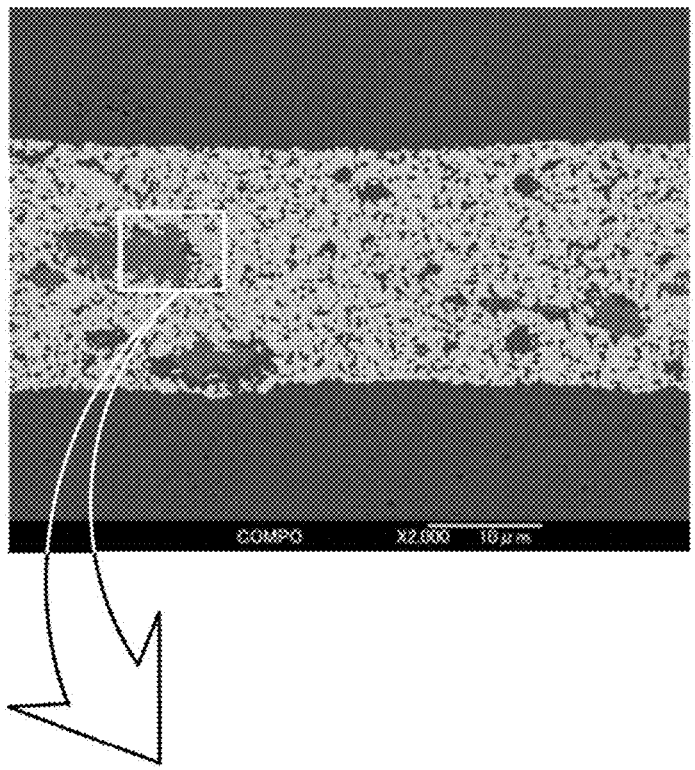
FIGS. 9A and 9B are SEM images of the vicinity of a heater electrode according to Example 1.
Figure 9B:
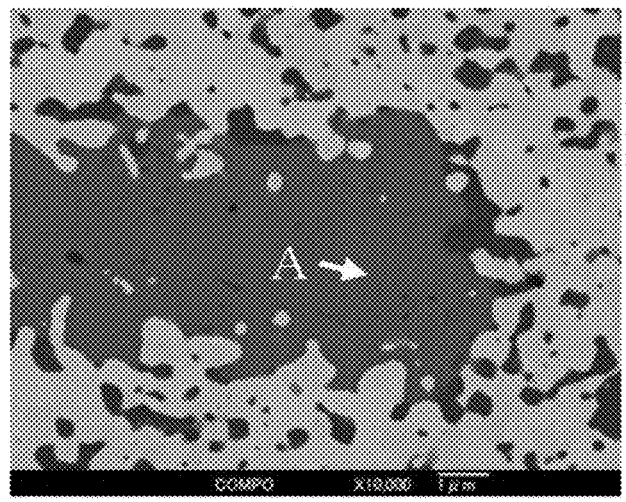
Figure 10:
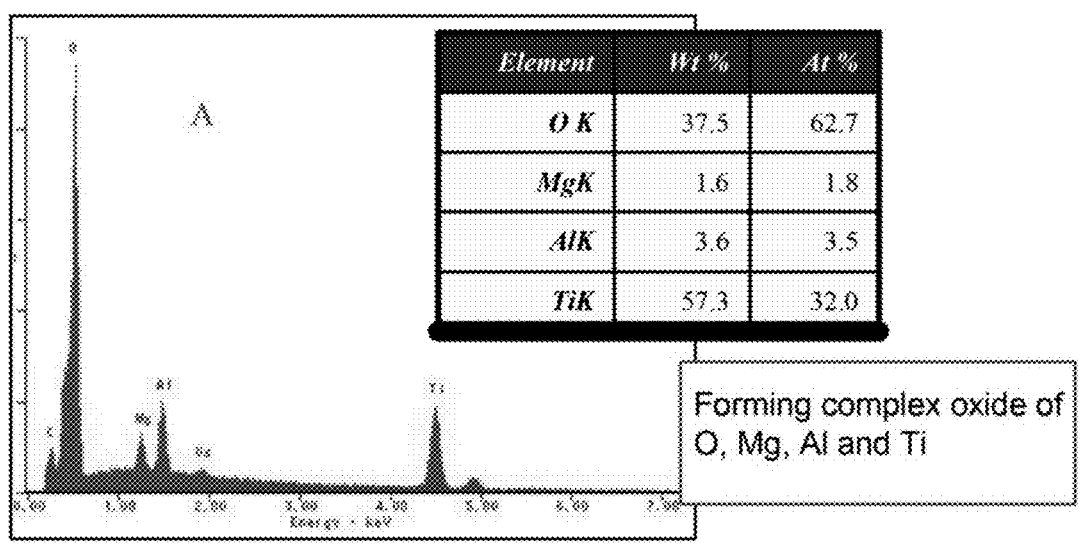
FIG. 10 is an EDX chart of a portion indicated by an arrow A in FIG. 9B.

FIGS. 9A and 9B are SEM images of the vicinity of a heater electrode according to Example 1. FIG. 9A is a cross section at a low magnification. FIG. 9B is an enlarged cross section of a square area in FIG. 9A. FIG. 10 is an EDX chart of a portion indicated by an arrow A in FIG. 9B. In FIG. 9A, whitish bands are composed of molybdenum, black dots in molybdenum is composed of alumina, and gray portions are composed of a complex oxide of magnesium, aluminum, and titanium (Ti—Al—Mg—O). FIGS. 9A and 9B and FIG. 10 show that the heater electrode according to Example 1 is composed of Mo at least containing a Ti component, more specifically, a complex oxide of titanium, aluminum, and magnesium (Ti—Al—Mg—O) dispersed in molybdenum. It is also shown that the heater electrode according to Example 1 contains only a minute amount of carbon component.

In Comparative Example 1, during hot-press firing, molybdenum reacted with carbon to form molybdenum carbide, which was unevenly distributed in the heater electrode, causing the reverse phenomenon of the temperature dependence of electric resistivity. Comparative Example 2 also had the reverse phenomenon. In contrast, in Examples 1 and 2, a titanium powder was added to the electrode paste, and titanium reacted with aluminum, magnesium, and oxygen to form a complex oxide (Ti—Al—Mg—O), thereby suppressing the reaction between molybdenum and carbon and ameliorating the reverse phenomenon of the temperature dependence of electric resistivity. In particular, use of the titanium ground powder in Example 2 further reduced in-plane variations in electric resistivity.

The present application claims priority on the basis of the Japanese Patent Application No. 2012-073871 filed on Mar. 28, 2012, the entire contents of which are incorporated herein by reference.

INDUSTRIAL APPLICABILITY

The present invention can be used as a member for use in semiconductor manufacturing equipment.

What is claimed is:
1. A ceramic heater, comprising:
   an alumina ceramic substrate; and
   a heater electrode embedded in the alumina ceramic substrate, the heater electrode comprising molybdenum,
   wherein the heater electrode contains a complex oxide of titanium, aluminum, and magnesium (Ti—Al—Mg—O) dispersed in the molybdenum.

2. The ceramic heater according to claim 1, wherein the alumina ceramic substrate is manufactured by adding magnesium fluoride as a sintering aid to alumina particles and firing the alumina particles, and the heater electrode is manufactured by using an electrode material containing a molybdenum powder, a titanium powder, and an alumina powder together with an acrylic binder.

3. A heater electrode adapted to be embedded in a ceramic heater made of an alumina ceramic, the heater electrode comprising molybdenum,
   wherein the heater electrode contains a complex oxide of titanium, aluminum, and magnesium (Ti—Al—Mg—O) dispersed in the molybdenum.

4. A method for manufacturing a ceramic heater, comprising:
   (a) charging a forming die with a slurry containing an alumina powder, magnesium fluoride serving as a sintering aid, a solvent, a dispersant, and a gelling agent, inducing a chemical reaction of the gelling agent in the forming die to cause gelation of the slurry, and removing a compact from the forming die, thus forming first and second ceramic compacts;
   (b) drying, degreasing, and then calcining the first and second ceramic compacts to form first and second ceramic calcined compacts;
   (c) printing a paste containing a molybdenum powder and a titanium powder to a surface of one of the first and second ceramic calcined compacts; and
   (d) hot-press firing the first and second ceramic calcined compacts with the printed paste interposed therebetween at a temperature in the range of 1120° C. to 1300° C.;
   the ceramic heater comprising an alumina ceramic substrate, and a heater electrode embedded in the alumina ceramic substrate, the heater electrode comprising molybdenum,
   wherein the heater electrode contains a complex oxide of titanium, aluminum, and magnesium (Ti—Al—Mg—O) dispersed in the molybdenum.

5. A method for manufacturing a ceramic heater, comprising:

(a) charging a forming die with a slurry containing an alumina powder, magnesium fluoride serving as a sintering aid, a solvent, a dispersant, and a gelling agent, inducing a chemical reaction of the gelling agent in the forming die to cause gelation of the slurry, and removing a compact from the forming die, thus forming first and second ceramic compacts;
(b) printing a paste containing a molybdenum powder and a titanium powder to a surface of one of the first and second ceramic compacts;
(c) drying, degreasing, and then calcining the first and second ceramic compacts to form first and second ceramic calcined compacts; and
(d) hot-press firing the first and second ceramic calcined compacts at a temperature in the range of 1120° C. to 1300° C. while a portion to which the paste is printed is interposed therebetween;
the ceramic heater comprising an alumina ceramic substrate, and a heater electrode embedded in the alumina ceramic substrate, the heater electrode comprising molybdenum,
wherein the heater electrode contains a complex oxide of titanium, aluminum, and magnesium (Ti—Al—Mg—O) dispersed in the molybdenum.

6. The method for manufacturing a ceramic heater according to claim 4, wherein the paste in an application of the paste is a mixture of a molybdenum powder, a titanium powder, an aluminum powder, and an acrylic binder.

7. The method for manufacturing a ceramic heater according to claim 5, wherein the paste in an application of the paste is a mixture of a molybdenum powder, a titanium powder, an aluminum powder, and an acrylic binder.

8. The method for manufacturing a ceramic heater according to claim 4, wherein the titanium powder is a ground powder.

9. The method for manufacturing a ceramic heater according to claim 5, wherein the titanium powder is a ground powder.

10. The method for manufacturing a ceramic heater according to claim 4, wherein the titanium powder has an average particle size in a range of 1.0 to 4.0 μm.

11. The method for manufacturing a ceramic heater according to claim 5, wherein the titanium powder has an average particle size in a range of 1.0 to 4.0 μm.

* * * * *